United States Patent
Park et al.

(10) Patent No.: US 7,810,695 B2
(45) Date of Patent: Oct. 12, 2010

(54) WIRE BONDING MACHINE CAPABLE OF REMOVING PARTICLES FROM CAPILLARY AND CLEANING METHOD OF CAPILLARY BOTTOM TIP

(75) Inventors: Soo Bok Park, Seoul (KR); Jin Won Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 864 days.

(21) Appl. No.: 11/228,791

(22) Filed: Sep. 16, 2005

(65) Prior Publication Data

US 2006/0289605 A1 Dec. 28, 2006

(30) Foreign Application Priority Data

Jun. 23, 2005 (KR) .................. 10-2005-0054418

(51) Int. Cl.
*B23K 37/00* (2006.01)
(52) U.S. Cl. ..................... 228/4.5; 228/180.5
(58) Field of Classification Search ............ 228/4.5, 228/180.5
See application file for complete search history.

(56) References Cited

U.S. PATENT DOCUMENTS

| | | | | |
|---|---|---|---|---|
| 2,378,271 A * | 6/1945 | Wheildon, Jr. | ............... | 451/548 |
| 3,136,614 A * | 6/1964 | Kuzmick | ..................... | 51/297 |
| 5,221,291 A * | 6/1993 | Imatani et al. | ................ | 51/293 |
| 6,474,538 B1 * | 11/2002 | Yonezawa et al. | ........... | 228/262 |
| 6,863,206 B2 * | 3/2005 | Kyomasu et al. | ............. | 228/1.1 |
| 2002/0096187 A1 * | 7/2002 | Kuwata et al. | ................. | 134/1 |
| 2005/0061849 A1 * | 3/2005 | Takahashi | ................... | 228/4.5 |

* cited by examiner

*Primary Examiner*—Kevin P Kerns
*Assistant Examiner*—Devang R Patel
(74) *Attorney, Agent, or Firm*—Weiss & Moy, P.C.

(57) ABSTRACT

A wire bonding machine capable of removing particles from capillary and cleaning method of capillary bottom tip uses a grinding film of the wire bonding machine mounted on a clamp block. The capillary of the wire bonding machine periodically moves on the grinding film and then, the bottom tip of the capillary is rubbed with and moves on the grinding film at a predetermined distance, whereby various particles formed at the bottom tip of the capillary are removed.

18 Claims, 5 Drawing Sheets

WIRE BONDING MACHINE CAPABLE OF REMOVING PARTICLES FROM CAPILLARY AND CLEANING METHOD OF CAPILLARY BOTTOM TIP

BACKGROUND OF THE INVENTION

1. Field of the Invention

The present invention relates to a wire bonding machine and, more specifically, to a wire bonding machine capable of removing particles from a capillary and a method for cleaning the bottom tip of the capillary.

2. Description of the Related Art

Generally, a wire bonding machine serves to electrically couple a semiconductor die to a circuit board (or a lead frame) by using wires. A capillary, having a pipe shape, is mounted to the wire bonding machine to handle fine wires. By using the capillary, one end of the wire is ball-bonded to the semiconductor die and the other end of the wire is stitch-bonded to the circuit board. That is, the wire bonding machine furnishes a discharge flame with the wire. The discharge flame extends to the bottom end of the capillary at a predetermined distance. Thereafter, the wire bonding machine allows the capillary to move toward the semiconductor die and then, furnishes ultrasonic waves with the capillary, so that the ball is bonded to the semiconductor die. Next, the wire bonding machine allows the capillary to move toward the circuit board and furnishes ultrasonic waves with the capillary again, so that the other end of the wire is bonded to the circuit board. After the stitch bonding of the wire, the wire is cut from the circuit board and the above process is repeated again.

In the meantime, the capillary, especially the capillary tip is under various severe circumstances. That is, the capillary tip is applied to the discharge flame and is contacted with the fused portion (ball) of the wire. Further, the capillary tip is directly and physically contacted with the semiconductor die and circuit board. Moreover, where the capillary is contacted with the semiconductor die and circuit board, since the ultrasonic wave energy is concentrated on the capillary tip, the circumstances becomes more critical.

As such, the more wire bonding that is performed, the more various foreign matters are accumulated on the capillary tip. The capillary particles itself based on the discharge flame and various metal particles based on the semiconductor die and the circuit board are irregularly accumulated on the capillary tip.

Since various particles may accumulate on the capillary tip, and since the tip shape of the capillary is not regular, various irregularities in the wire bonding process may be generated. This is especially true at the stitch bonding area of the wire. That is, since the size of the ball bonding area is much larger than the diameter of the wire, because the size of the stitch bonding area is similar to the diameter of the wire, the irregularities are mainly generated at the stitch bonding area. The dimension of the stitch area is only approximately 1-20% of that of the ball bonding area. Accordingly, if various particles are accumulated on the capillary tip as described above, since the size of the stitch bond area becomes smaller, the irregularities of the wire bonding process can often be generated.

In order to solve the irregularities of the wire bonding process owing to the capillary, the capillary is periodically separated from the wire bonding machine and cleaned. For example, the capillary is treated with chemicals, so that the various particles are removed from the capillary. Here, since the chemicals can damage the capillary, the capillary should necessarily be examined with the naked eye, after the chemical treatment. However, the chemical treatment of the capillary takes a long time and the capillary itself can be damaged according to circumstances. Moreover, because the chemicals usually have a strong acidity, it can bring about an environment pollution problem.

Instead of using the chemicals as above, there is a method where an operator physically cleans up the capillary tip by using a soft brush. However, in actuality, it is very difficult to clean up the very small capillary by the brush and the like. Furthermore, since the operation is manually performed, the removing measure of the particle varies per the capillary, so there is difficulty in reusing the capillary.

BRIEF SUMMARY OF THE INVENTION

A wire bonding machine and method of cleaning has a capillary having a bottom tip. A bonding arm is coupled to the capillary for transmitting ultrasonic wave energy to the bottom tip of the capillary. The bonding arm is able to move in a direction of X-Y-Z at a predetermined distance. A grinding film is positioned below the capillary. The bottom tip of the capillary moves along a predetermined path of the grinding film. The moving of the bonding arm removes particles formed at the bottom tip of the capillary.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
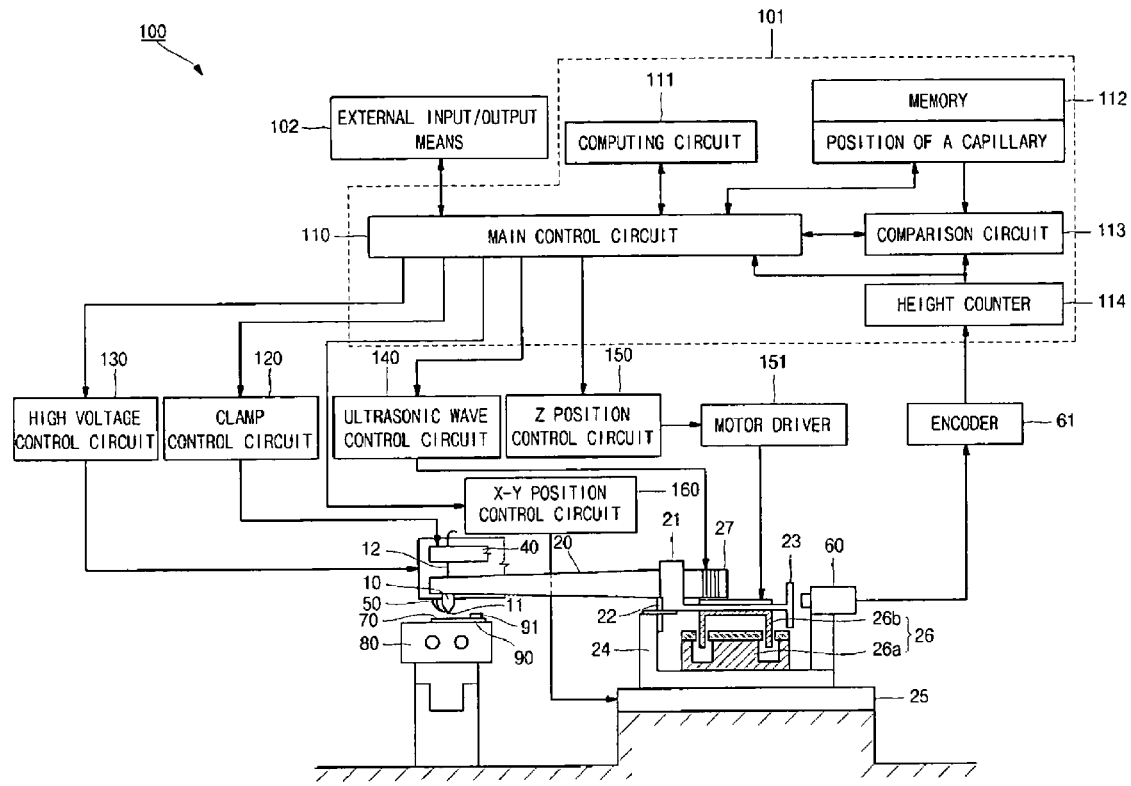
FIG. 1 is a schematic view of a wire bonding machine according to the present invention.

Referring to FIG. 1, a schematic view of a wire bonding machine 100 according to the present invention is illustrated. As shown in FIG. 1, the wire bonding machine 100 according to the present invention includes a capillary 10 having a bottom tip 11, a bonding arm 20 on which the capillary 10 is mounted, a grinding film 70 for removing particles from the capillary bottom tip 11 by a friction between them.

A bonding wire 12 generally passes through the capillary 10. However, the wire 12 is removed from the capillary 10, during cleaning of the capillary bottom tip 11. In order to remove the wire 12 from the capillary as above, a clamp 40 for clamping the wire 12 is mounted on the upper portion of the capillary 10. Also, a discharge blade 50 is mounted on the side portion of the capillary 10 and furnishes a discharge spark to the wire 12, which extends downwardly through the capillary 10 at a predetermined length during bonding.

The capillary 10 is mounted on one end of the bonding arm 20. Also, a supporting frame 21 is combined with the other end of the bonding arm 20. A plate spring 22 is combined with one end of the supporting frame 21 and a linear scale 23 is combined with the other end of the supporting frame 21. The plate spring 22 is connected to one side of a moving table 24, which is mounted on X-Y table 25. With such X-Y table 25, the moving table 24 can move in the direction of X-Y plane at a predetermined distance. A linear motor 26 is mounted on the moving table 24 so that the bonding arm 20 can go up and come down in the Z direction. The linear motor 26 includes a magnet 26a and a coil 26b wound on the support frame 21 several times and having a predetermined area connected to the magnet 26a. A position detecting sensor 60 is mounted to the moving table 24 and detects the position of the linear scale 23, so that it detects the height of the ascent and descent of the capillary 10 indirectly. Moreover, a vibrator 27 for generating ultrasonic waves is mounted on the other end of the bonding arm 20. With the vibrator 27, the ultrasonic waves energy can be transmitted through the bonding arm 20 during wire-bonding.

The grinding film 70 is below the lower portion of the capillary 10. That is, the grinding film 70 is mounted on a predetermined area of a clamp block 80, at which a semiconductor device is located, for wire-bonding operation. The clamp block 80 serves to fix the semiconductor device for wire-bonding operation. Also, the grinding film 70 can be mounted to a cleaning die 90, which can be attached and detached to the clamp block 80 through a bolt 91.

An electrical construction for controlling the above wire bonding machine 100 will be briefly described herein below. The wire bonding machine 100 according to the present invention is properly controlled by a computer 101. The computer includes a main control circuit 110, a computing circuit 111, a memory 112, a comparison circuit 113, and a height counter 114 for counting the Z-axis height of the bonding arm 20. Also, a clamp control circuit 120 for controlling the clamp 40, a high voltage control circuit 130 for controlling the discharge blade 50, a ultrasonic wave control circuit 140 for controlling the vibrator 27, and a Z position control circuit 150 for controlling the linear motor 26 are connected to the main control circuit 110. The Z position control circuit 150 is further connected to a motor driver 151, in order that proper voltage or current signals can be applied to the linear motor 26. The height counter 114 is further connected to an encoder 61, in order to convert the inputted analog signals into digital signals and output them. Moreover, the main control circuit 110 is further connected to an X-Y position control circuit 160 for controlling the X-Y table 25. The reference numeral 102 denotes a LAN card as external input/output means, which is communicated with the computer 101 through a CD-ROM, a diskette and so on.

In the wire bonding machine 100 according to the present invention having the above mentioned configuration, if predetermined signals from the main control circuit 110 are transmitted to the clamp control circuit 120, the clamp control circuit 120 clamps the wire 12 passing through the capillary 10. In this case, the main control circuit 110 outputs predetermined control signals to the Z position control circuit 150 again and then, the Z position control circuit 150 outputs the signals to the motor driver 151. The motor driver 151 applies predetermined voltage or current signals to the linear motor 26, namely the coil 26b and then, with the bonding arm 20, the capillary 10 descends at a predetermined height, centering around the plate spring 22. In that case, since the clamp 40 clamps the wire 12, the wire 12 is separated from the capillary 10.

Meanwhile, the ultrasonic wave control circuit 140 serves to output predetermined electrical signals to the vibrator 27, so as to transmit the ultrasonic waves energy to the bottom tip 11 of the capillary 10 during wire-bonding or cleaning of the bottom tip 11 of the capillary 10. The high voltage control circuit 130 serves to output predetermined electrical signals to the discharge blade 50, so as to form the ball on the lower end of the wire 12 passing through the capillary during wire-bonding. Also, the X-Y position control circuit 160 serves to output predetermined electrical signals to the X-Y table 25, so as to move the moving table 24 in the predetermined direction. Moreover, the height information is inputted to the encoder 61 by means of the position detecting sensor 60 and then, the height information of the encoder 61 is inputted to the main control circuit 110 through the height counter 114. The height information of the capillary 10 in connection with the height of the linear scale 23 is stored in the memory 112 in advance. The main control circuit 110 calculates the actual height of the capillary 10 through the computing circuit 111 from the value obtained by the memory 112.

Figure 2:
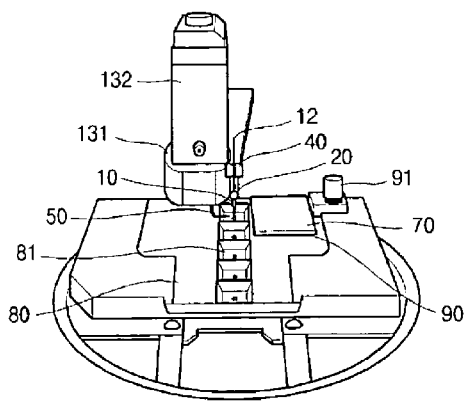
FIG. 2 is a schematic view of a front structure of a wire bonding machine according to the present invention.

As shown in FIG. 2, the capillary 10 is mounted to the front portion of the bonding arm 20. The clamp 40 for clamping or unclamping the wire 12 is mounted on the upper portion of the bonding arm 20. The discharge blade 50 is mounted on one side of the bonding arm 20 and the high voltage control circuit 130 is connected to the upper part of the discharge blade 50 in the form of a box.

The clamp block 80 is mounted to the lower portion of the capillary 10. Though it is not shown in the figure, the semiconductor device, which is actually wire-bonded, is located at the clamp block 80. Here, the capillary 10 mainly moves on the semiconductor device located at the clamp block 80 in the direction of X-Y-Z and conducts the wire-bonding operation.

In the meantime, the grinding film 70 is located on the clamp block 80 located at the outside of a region 81, at which the semiconductor device is located, for wire-bonding operation. Also, as shown, the grinding film 70 is mounted to the cleaning die 90, which can be freely attached and detached to the clamp block 80. Here, the cleaning die 90 can be freely attached and detached to the clamp block 80 through a bolt 91 and so forth.

The reference numerals 132 and 131 denote a camera and a camera lens respectively.

Figure 3A:
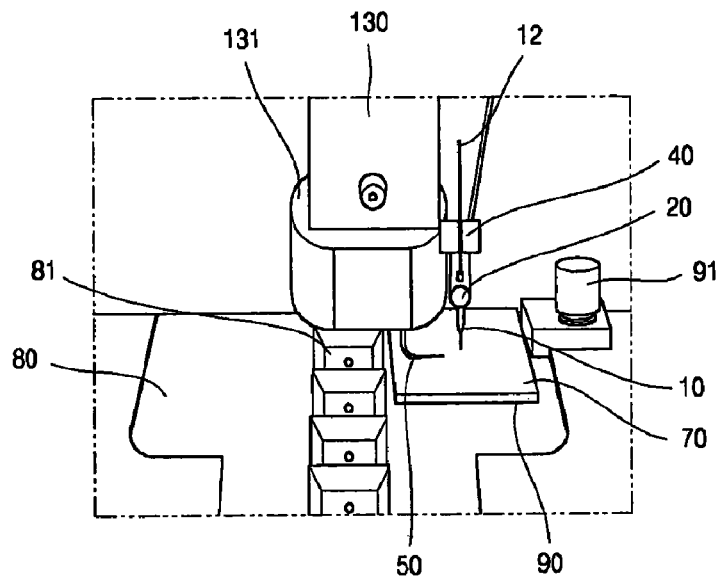
FIG. 3A is a perspective view illustrating a state in which a capillary of a wire bonding machine according to the present invention moves on a grinding film.

As shown in FIG. 3A, the capillary 10 ascends to a predetermined height in the direction of the Z-axis and moves at a predetermined distance in the direction of X-Y plane, so that the capillary 10 is positioned on the upper portion of with the grinding film 70 outside a region 81 on which the semiconductor die is placed. In order to move the capillary 10 as above, the main control circuit 110, the Z position control circuit 150, and the motor driver 151 are operated in order, thereafter the linear motor 26 is operated. That is, the predetermined voltage or current signals are applied to the coil 26b of the linear motor 26. In that case, the bonding arm 20 is rotated around the plate spring 22, which is mounted between on the support frame 21 and the moving table 24, at a predetermined angle. For example, the vibrator 27 of the bonding arm 20 descends to a predetermined height and the capillary 10 ascends to a predetermined height. At this time, the X-Y table 25 is operated by means of the main control circuit 110 and X-Y position control circuit 160. Then, the moving table 24 moves in the direction of X-Y at a predetermined distance, so that the capillary 10 is located on the upper portion of the grinding film 70.

Figure 3B:
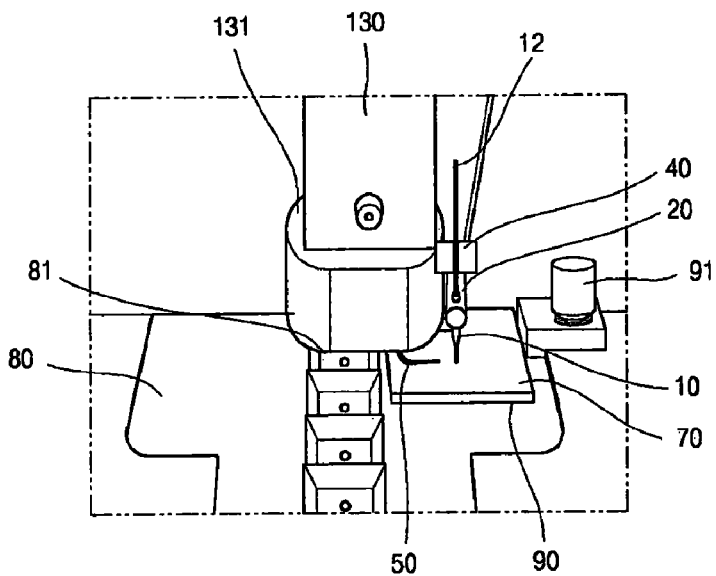
FIG. 3B is a perspective view illustrating a state in which a capillary is contacted and rubbed with a grinding film in a predetermined direction.

Continuously, as shown in FIG. 3B, the capillary 10 descends to a predetermined height in the direction of the Z-axis and the capillary bottom tip 11 is contacted with the surface of the grinding film 70. In order to move the capillary 10 as above, the main control circuit 110, the Z position control circuit 150, and the motor driver 151 are operated in order, thereafter the linear motor 26 is operated. That is, the predetermined voltage or current signals are applied to the coil 26b of the linear motor 26. In that case, the bonding arm 20 is rotated around the plate spring 22, which is mounted between on the support frame 21 and the moving table 24, at a predetermined angle. That is, the vibrator 27 of the bonding arm 20 ascends to a predetermined height and the capillary 10 descends to a predetermined height. Accordingly, the capillary bottom tip 11 is contacted with the surface of the grinding film 70. At this time, the position detecting sensor 60 detects the position of the linear scale 23 and outputs the detected signals to the encoder 61. Then, the encoder converts the signals into digital signals and outputs them to the height counter 114. The counter outputs the height information to the main control circuit 110. Also, the main control circuit 110 allows the height information of the capillary 10 to be stored in the memory 112.

Subsequently, the X-Y table 25 is operated by means of the main control circuit 110 and X-Y position control circuit 160. The moving table 24 moves in the direction of X-Y at a predetermined distance, the moving table 24, the plate spring, the support frame 21 and the bonding arm 20, which are mounted on the X-Y table 25, are moved together. Accordingly, the capillary 10, which is mounted to the end of the bonding arm 20, moves in a predetermined direction, while being rubbed with the surface of the grinding film 70. That is, the capillary bottom tip 11 moves in a predetermined direction, while being directly rubbed with the grinding particles of the grinding film 70.

Figure 4A:
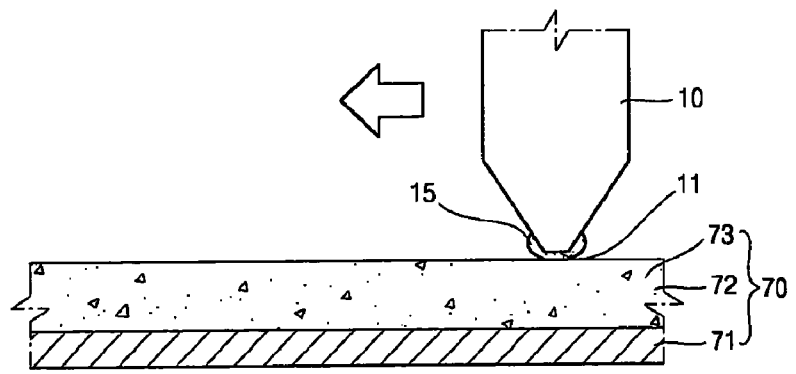
FIG. 4A is an enlarged cross sectional view illustrating a state in which a capillary of a wire bonding machine according to the present invention is contacted and rubbed with the grinding film in a predetermined direction.

As shown in FIG. 4A, the grinding film 70 includes a film 71 made of a polyester or other material, a plurality of grinding particles 73 bonded on the film 71 by means of an adhesive 72 made of a copolymerization of a polyester resin, a polyurethane resin, a copolymerization of a vinyl chloride.vinyl oxide resin, a copolymerization of a vinyl chloride.acryl resin and the like. The material of the grinding particle 73 may be any one of SiC, $Al_2O_3$, SD(an artificial diamond), $Cr_2O_3$, $Fe_2O_3$, $ZrO_2$, $CeO_2$, $SiO_2$, $BaCO_3$, and other various compounds identical to that of the capillary 10. However, the present invention is not limited to any kind of the grinding particle 73 listed above. It is preferred that the diameter of the grinding particle 73 is approximately 0.1~100 um, in order that the particles 15 accumulated on the capillary bottom tip 11 are easily removed and the capillary bottom tip 11 is not damaged. Here, where the diameter of the grinding particle 73 is below 0.1 um, the removing efficiency of the particles 15 is not as effective. On the other hand, where the diameter of the grinding particle 73 is above 100 um, the capillary bottom tip 11 can be damaged.

Figure 4B:
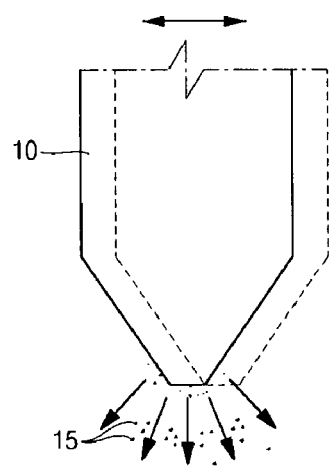
FIG. 4B is an enlarged cross sectional view illustrating a state in which particles are separated from a capillary bottom on account of a ultrasonic wave vibration after a capillary is separated from a grinding film.

As shown in FIG. 4B, the capillary 10 ascends to a predetermined height after it is rubbed with the grinding film 70.

Here, in order to ascend the capillary 10 as above, the main control circuit 110, the Z position control circuit 150, the motor driver 151 and the linear motor 26 are operated in order. Then, the main control circuit 110 outputs predetermined signals to the ultrasonic wave control circuit 140. The ultrasonic wave control circuit 140 outputs the predetermined electrical signals to the vibrator 27 so that the ultrasonic waves are generated from the vibrator 27. The ultrasonic waves are transmitted to the capillary 10 through the bonding arm 20 and the capillary 10 is minutely vibrated in a predetermined frequency. Accordingly, all kinds of particles, which are weakly adhered to the bottom tip 11 of the capillary 10, are separated from the bottom tip altogether. That is, as described above, the bottom tip 11 of the capillary 10 is rubbed with the grinding film 70, so that all kinds of particles 15 formed at the bottom tip 11 are separated from the bottom tip altogether or are weakly attached on the bottom tip. Accordingly, where the ultrasonic wave energy is transmitted to the bottom tip 11 of the capillary 10 through the bonding arm 20, all of particles 15 attached to the bottom tip 11 are cleanly separated from the bottom tip.

Referring to FIG. 5A through FIG. 5H, a moving path of the capillary of the wire bonding machine according to the present invention, which is contacted and rubbed with the grinding film, is illustrated. Here, the moving path of the capillary may be variously changed. The present invention is not limited to any shape of the moving path. Also, the moving of the capillary is implemented by the X-Y table as described above.

Figure 5A:
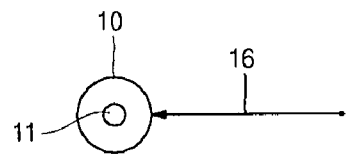
FIG. 5A through FIG. 5H are a view illustrating a moving path of a capillary of a wire bonding machine according to the present invention, which is contacted and rubbed with a grinding film.

As shown in FIG. 5A, the moving path 16 of the capillary bottom tip 11 may be in the form of an approximate straight line having a predetermined length on the grinding film 70.

Figure 5B:
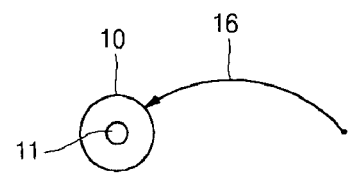

Also, as shown in FIG. 5B, the moving path 16 of the capillary bottom tip 11 may be in the form of an approximate curved line having a predetermined length on the grinding film 70.

Figure 5C:
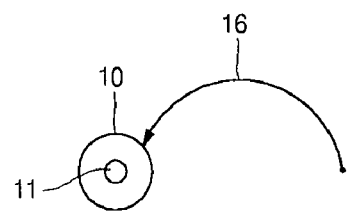

Moreover, as shown in FIG. 5C, the moving path 16 of the capillary bottom tip 11 may be changed one time on the grinding film 70. Here, the shape of the moving path 16 of FIG. 5C is similar to that of FIG. 5B.

Figure 5D:
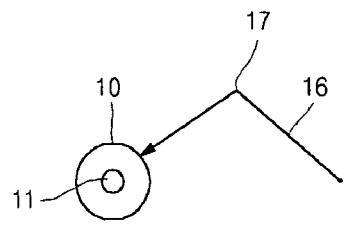

Furthermore, as shown in FIG. 5D, the moving path 16 of the capillary bottom tip 11 may be in the form of an approximate straight line of a predetermined length having at least one angular point 17 on the grinding film 70.

Figure 5E:
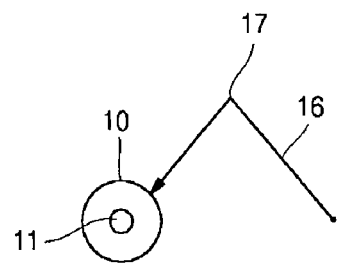

Also, as shown in FIG. 5E, the angular point of moving path 16 of the capillary bottom tip 11 may be an acute angle.

Figure 5F:
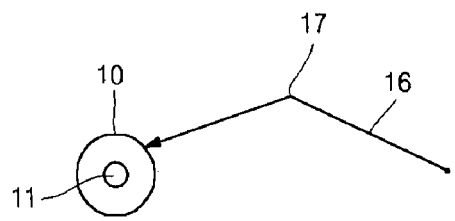

Moreover, as shown in FIG. 5F, the angular point of moving path 16 of the capillary bottom tip 11 may be an obtuse angle.

Figure 5G:
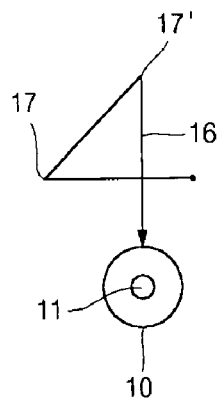

Furthermore, as shown in FIG. 5G, the moving path 16 of the capillary bottom tip 11 may be in the form of an approximate straight line of a predetermined length having at least two angular points 17 and 17' on the grinding film 70. The shape of the moving path 16 is similar to a numeral "4". Where the moving path 16 has the above mentioned shape, the most particles are removed from the bottom tip 11 of the capillary 10.

Figure 5H:
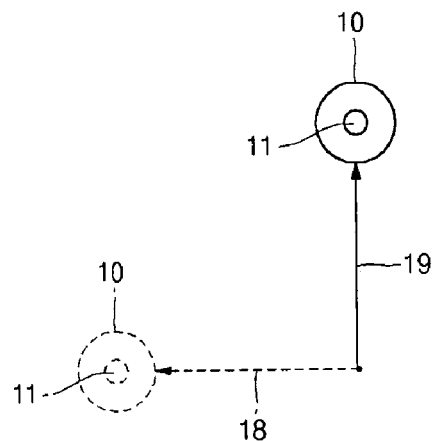

Also, as shown in FIG. 5H, after the capillary 10 ascends to a predetermined height toward the upper portion of the grinding film 70, it descends to the surface of the grinding film 70 again and then, it contacts with and moves on the grinding film 70. Here, the capillary 10 can be changed from the early moving direction at a predetermined angle. That is, if the early moving direction 18 of the capillary 10 is from the east to the west, after that, the moving direction 19 of the capillary may be from the south and to the north. Here, the changed friction and moving path of the capillary 10 may be applied to all paths shown in FIG. 5B through FIG. 5G. The changed angle may be approximately 45 or 90 degrees and so forth. However, the present invention is not limited to any angle.

Figure 6A:
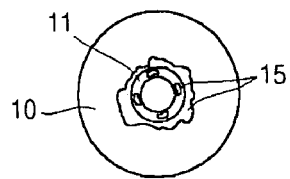
FIG. 6A is an enlarged view illustrating a capillary bottom tip prior to cleaning.
Figure 6B:
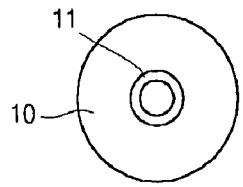
FIG. 6B is an enlarged view illustrating a capillary bottom tip next to cleaning.

As shown in FIG. 6A, a plurality of particles 15 are formed on the bottom tip 11 of the capillary prior to cleaning. The particles 15 are formed by means of the discharged flame, the fused wires, the semiconductor die and the circuit board and so on. However, as shown in FIG. 6B, all of the particles are removed from the bottom tip 11 of the capillary after cleaning.

Figure 7:
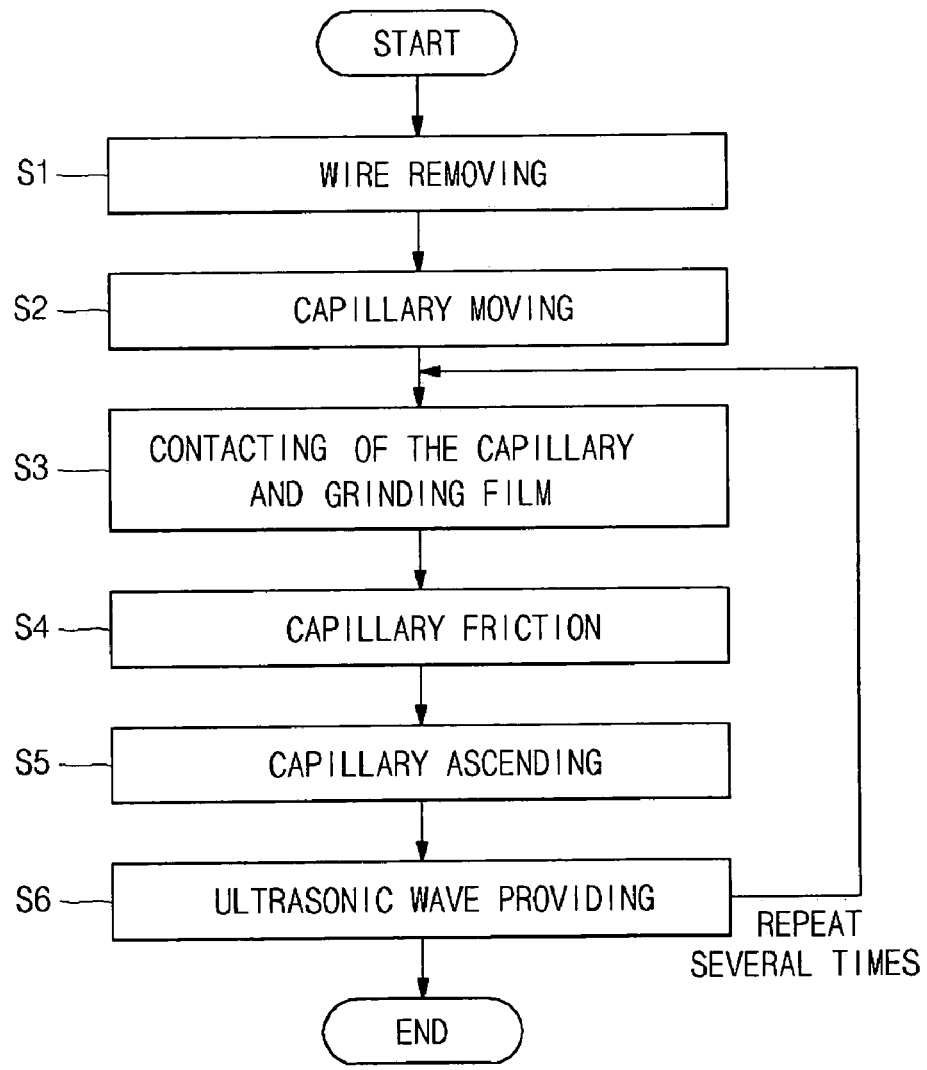
FIG. 7 is a flow chart for explaining a cleaning method of a capillary bottom tip according to the present invention.

Referring to FIG. 7, a flow chart for explaining a cleaning method of a capillary bottom tip is illustrated. As shown, the cleaning method of the capillary bottom tip includes a wire removing step S1, a capillary moving step S2, a contacting step S3 of the capillary and a grinding film, a capillary friction step S4, a capillary ascending step S5, and a ultrasonic wave providing step S6.

The cleaning method of the capillary bottom tip will be described referring to FIG. 7 as well as FIG. 1 through FIG. 6b herein below.

Firstly, in the wire removing step S1, the wire 12 is removed from the capillary 10. That is, the clamp 40 mounted on the upper portion of the capillary 10 and the bonding arm 20, on which the capillary 10 is mounted, are controlled, so that the wire 12 is removed from the capillary 10. More concretely, the main control circuit 110 outputs predetermined control signals to the clamp control circuit 120, in order that the clamp 40 clamps the wire 12. At the same time, the main control circuit 110 outputs predetermined control signals to the Z position control circuit 150, so as to descend the capillary 10 mounted on the bonding arm 20 at a predetermined distance. Here, the Z position control circuit 150 outputs the predetermined control signals to the motor driver 151. In that case, the motor driver 151 outputs predetermined voltage or current signals to the linear motor 26, so that the predetermined voltage or current signals is applied to the coil 26b. Thereafter, the coil 26b is wound on a predetermined area and the support frame 21 connected to the bonding arm 20 is rotated around the plate spring 22 at another predetermined region. For instance, the vibrator 27 of the bonding arm 20 ascends to a predetermined height and the capillary 10 descends to a predetermined height. Accordingly, since the wire 12 is adhered to the clamp 40, the wire 12 is naturally separated from the capillary 10.

Continuously, in the capillary moving step S2, it allows the capillary 10 to move on the upper portion of the grind film 70 from the semiconductor device. As described above, the grinding film 70 can be mounted on the clamp block 80. Here, the grinding film 70 may be mounted to the cleaning die 90, which can be freely attached and detached to the clamp block 80. As above, the main control circuit 110 outputs predetermined control signals to the X-Y position control circuit 160, so as to move the capillary 10 on the upper portion of the grinding film 70, which is located at the peripheral of the semiconductor device. Then, the X-Y table 25 is operated by the X-Y position control circuit 160, so that the moving table 24 moves in the direction of X-Y at a predetermined distance, up to the appointed position in advance. Here, as described above, the support frame 21 is connected to the moving table 24 through the plate spring 22, and the bonding arm 20 having the capillary 10 is mounted on the support frame 21, so that the capillary 10 is moved in the desired direction of X-Y in the long run. That is, the capillary 10 is moved on the upper portion of the grinding film 70.

Subsequently, in the contacting step S3 of the contracting of the capillary and grinding film, it descends the capillary 10 slowly, so that the bottom tip 11 of the capillary 10 is contacted with the grinding film 70 by a predetermined strength. That is, where the capillary 10 is contacted with the grinding film 70 by a strong strength or very rapidly, it is easy for the capillary bottom tip 11 or the grinding film 70 to damage. On the other hand, where the capillary 10 is contacted with the grinding film 70 by a very weak strength, the cleaning of the capillary bottom tip 11 is not good.

In the meantime, in order to contact the capillary 10 with the grinding film 70, the main control circuit 110 outputs predetermined control signals to the Z position control circuit 150, so that the capillary 10 mounted on the bonding arm 20 descends at a predetermined distance. Here, the Z position control circuit 150 outputs the predetermined control signals to the motor driver 151. In that case, the motor driver 151 outputs predetermined voltage or current signals to the linear motor 26, so that the predetermined voltage or current signals is applied to the coil 26b of the linear motor 26. Thereafter, the coil 26b is wound on a predetermined area and the support frame 21 connected to the bonding arm 20 is rotated around the plate spring 22 at another predetermined region. That is, the capillary 10 descends and is contacted with the grinding film 70 by a predetermined strength or speed. Also, the position detecting sensor 60, which is mounted on the moving table 24, detects the position of the linear scale 23 connected to the support frame 21. That is, the position detecting sensor 60 detects the position of the capillary 10. Here, in order to calculate the detected values in the computer, the position detecting sensor 60 transmits the predetermined signals into the encoder 61. Then, the encoder 61 converts the signals into digital signals and outputs them to the height counter 114. If so, the main control circuit 110 allows the present position of the capillary 10 to be stored in the memory 112.

In succession, in the capillary friction step S4, the bottom tip 11 of the capillary 10 has a predetermined path on the surface of the grinding film 70 and moves at a predetermined distance thereon. Here, in order to move the capillary 10 as above, the main control circuit 110 outputs predetermined control signals to the X-Y position control circuit 160, so that the X-Y table 25 is operated. Then, by means of the operation of the X-Y table 25, the moving table 24 moves along a predetermined path, the plate spring 22 connected to the moving table 24, the support frame 21, the bonding arm 20, and the capillary 10 is moved in the direction of X-Y in a body.

Here, the friction and moving path of the bottom tip 111 of the capillary 10 may be changed variously. For instance, the friction and moving path of the bottom tip 111 of the capillary 10 may be in the form of a straight line having a predetermined length or curved line having a predetermined length. Also, the friction and moving path of the bottom tip 111 of the capillary 10 may be changed one time on the grinding film. Moreover, the friction and moving path of the bottom tip 111 of the capillary 10 may be in the form of a straight line of a predetermined length having at least one angular point. Furthermore, the angular point of the friction and moving path of the bottom tip 111 of the capillary 10 may be an acute angle or an obtuse angle. Also, the friction and moving path of the bottom tip 111 of the capillary 10 may be in the form of a straight line of a predetermined length having at least two angular points. The friction and moving path of the bottom tip 111 of the capillary 10 is presented as only one example and the present invention is not limited to any moving path.

Continuously, in the capillary ascending step S5, the capillary 10 ascends to a predetermined height from the surface of the grinding film 70. Here, in order to ascend the capillary 10 as above, the main control circuit 110, the Z position control circuit 150, the motor driver 151 and the linear motor 26 are operated in order. Here, the predetermined voltage or current signals is applied to the coil 26b of the linear motor 26, so that the support frame 21 is rotated around the plate spring 22. Accordingly, the capillary 10 connected to the bonding arm 20 ascends to a predetermined height In the meantime, the main control circuit 110 outputs predetermined signals to the ultrasonic wave control circuit 140. If so, the ultrasonic wave control circuit 140 outputs the predetermined electrical signals to the vibrator 27, which is mounted to the end of the bonding arm 20, so that the ultrasonic waves are generated from the vibrator 27. The ultrasonic waves are transmitted to the capillary 10 through the bonding arm 20. In that case, all kinds of particles, which are weakly adhered to the bottom tip 11 of the capillary 10, fall down to a lower portion thereof. That is, all kinds of particles 15 formed at the bottom tip 11 of the capillary 10 are separated by friction with the grinding film 70 or are weakly attached on the bottom tip. Accordingly, where the ultrasonic wave energy is transmitted to the capillary 10, all of particles 15 attached weakly to the bottom tip 11 are cleanly removed, owing to the vibration of the capillary 10.

As such, the capillary cleaning of one cycle can be completed. However, in the present invention, the step S3 through the step S5 can be repeated several times. This is selectively conducted according to the amount of the particles accumulated on the capillary bottom tip 11. Meanwhile, where the step S3 is repeated, it is unnecessary for the capillary 10 to descend very slowly toward the grinding film 70, as described above. This is because the contacting position between the bottom tip 11 of the capillary 10 and the grinding film 70 is already stored in the memory 112 as described above. Accordingly, the main control circuit 110 receives the present position of the capillary 10, which is detected by the position detecting sensor 60 in accordance with the descent of the capillary 10, through the encoder 61 and the height counter 114 and then, compares the position of the capillary 10 stored in the memory 112 with the inputted present position of the capillary 10 through the comparison circuit 113. Also, as a result of the comparison through the comparison circuit 113, in a case that the inputted present position of the capillary 10 is identical with the position of the capillary 10 stored in the memory 112, the main control circuit 110 outputs predetermined signals to the Z position control circuit 150, so at to stop the descent of the capillary 10.

Meanwhile, after the above step S3, when the step S4 is performed, the bottom tip 11 of the capillary 10 is rubbed with and moves on the grinding film 70, somewhat dissimilarly to the above method. That is, the capillary 10 is changed from the early moving direction at a predetermined angle. For example, if the early moving direction of the capillary 10 goes west, the moving direction of the capillary 10 is changed in the direction of approximate northwest or north. Here, the change of the moving direction of the capillary 10 is presented as only one example and the moving direction of the capillary 10 may be variously changed. Also, it is preferred that the moving direction of the capillary 11 is changed each time that step 4 is performed. Here, in order to change the moving direction of the capillary 10, the main control circuit 110 outputs predetermined control signals to the X-Y position control circuit 160, so that it allows the X-Y position control circuit 160 to control X-Y table 25.

Moreover, after the friction and moving of the capillary 10, the capillary ascending step S5 and the ultrasonic wave providing step S6 are performed in turn, so that two cycles of the capillary cleaning according to the present invention are completed. Here, after the two cycles of the capillary cleaning are performed, an additional cycle, for example three or four cycles and so on, can be conducted.

This disclosure provides exemplary embodiments of the present invention. The scope of the present invention is not limited by these exemplary embodiments. Numerous variations, whether explicitly provided for or implied by the specification, such as variations in structure, dimension and type of material and the manufacturing process may be implemented by one who is skilled in the art, in view of this disclosure.

What is claimed is:

1. A wire bonding machine comprising:
   a capillary having a bottom tip;
   a vibration unit;
   a bonding arm coupled to the capillary and the vibration unit for transmitting ultrasonic waves energy from the vibration unit to the bottom tip of the capillary, wherein the bonding arm moves in a direction of X-Y-Z at a predetermined distance;
   a grinding film positioned below the capillary, wherein the bottom tip of the capillary moves along a predetermined path of the grinding film by moving of the bonding arm removing particles formed at the bottom tip of the capillary;
   a clamp block positioned below the lower portions of the capillary and bonding arm and on top of a semiconductor device, the clamp block having an open area for wire bonding the semiconductor device;
   a clamp positioned on an upper portion of the capillary for securing a wire for wire bonding the semiconductor device;
   a cleaning die positioned on and removably attached to the clamp block and directly next to the open area for wire bonding the semiconductor device, the grinding film attached to the cleaning die;
   a vibration unit control circuit coupled to the vibration unit to send control signals to the vibration unit;
   a clamp control circuit coupled to the clamp for securing and releasing the wire; and
   a control mechanism coupled to the vibration unit control circuit and the clamp control circuit, the control mechanism providing automated cleaning of the bottom tip by sending a clamp control signal to allow removal of the wire, sending a vibration unit control signal to transmitting ultrasonic waves energy from the vibration unit to the bottom tip of the capillary and for detecting a present location of the bottom tip of the capillary and comparing the present location to a contact position of the cleaning die to have the bottom tip contact the cleaning die.

2. A wire bonding machine in accordance with claim 1, wherein the cleaning die positioned on the clamp block and directly next to the open area for wire bonding the semiconductor die minimizes a travel distance of the bottom tip during cleaning.

3. A wire bonding machine in accordance with claim 1, wherein the grinding film comprises:
   a film of a predetermined thickness;
   a plurality of grinding particles bonded on the film; and
   an adhesive for bonding the plurality of grinding particles on the film.

4. A wire bonding machine in accordance claim 3, wherein the plurality of grinding particles are selected from one of: SiC, $Al_2O_3$, SD (an artificial diamond), $Cr_2O_3$, $Fe_2O_3$, $ZrO_2$, $CeO_2$, $SiO_2$, $BaCO_3$, and a combination thereof.

5. A wire bonding machine in accordance claim 1, further comprising:
   a moving table coupled to the bonding arm for moving the bonding arm in the direction of X-Y; and a linear motor coupled to the moving table for moving the bonding arm in the direction of Z.

6. A wire bonding machine in accordance claim 1, wherein the control mechanism comprises:
   an X-Y control circuit coupled to the bonding arm for controlling X-Y movement of the bonding arm;
   a Z control circuit coupled to the bonding arm for controlling Z movement of the bonding arm;
   a position detection sensor for detecting movement of the capillary; and
   a comparison circuit for and comparing the present location of the bottom tip of the capillary to the contact position of the cleaning die to minimize movement in an X-Y-Z direction of the capillary.

7. A wire bonding machine in accordance claim 1, further comprising a position detection sensor coupled to the moving table for detecting movement of the capillary.

8. A wire bonding machine comprising:
   a capillary having a bottom tip;
   a vibration unit;
   a bonding arm coupled to the capillary and the vibration unit for transmitting ultrasonic waves energy from the vibration unit to the bottom tip of the capillary, wherein the bonding arm moves in a direction of X-Y-Z at a predetermined distance;
   means positioned below the capillary for removing particles formed at the bottom tip of the capillary when the bottom tip of the capillary moves along a predetermined path of the means;
   a clamp block positioned below the lower portions of the capillary and bonding arm and on top of a semiconductor device, the clamp block having an open area for wire bonding the semiconductor device;
   a clamp positioned on an upper portion of the capillary for securing a wire for wire bonding the semiconductor device;
   a cleaning die positioned on and removably attached to the clamp block and directly next to the open area for wire bonding the semiconductor device, the means for removing particles attached to the cleaning die;
   a vibration unit control circuit coupled to the vibration unit to send control signals to the vibration unit;
   a clamp control circuit coupled to the clamp for securing and releasing the wire; and
   means coupled to the vibration unit control circuit and the clamp control circuit for providing automated cleaning of the bottom tip by sending a clamp control signal to allow removal of the wire, sending a vibration unit control signal to transmitting ultrasonic waves energy from the vibration unit to the bottom tip of the capillary and for detecting a present location of the bottom tip of the capillary and comparing the present location to a contact position of the cleaning die to minimize movement in an X-Y-Z direction between the capillary and the means for removing particles.

9. A wire bonding machine in accordance with claim 8 further comprising means coupled to the bonding arm for moving the bonding arm in the directions of X-Y-Z at predetermined distances.

10. A wire bonding machine in accordance claim 8, further comprising:
   means coupled to the bonding arm for moving the bonding arm in the direction of X-Y; and
   means coupled to the bonding arm for moving the bonding arm in the direction of Z.

11. A wire bonding machine in accordance with claim 8, wherein the means for removing particles comprises:
   a film of a predetermined thickness;
   a plurality of grinding particles bonded on the film; and
   means for bonding the plurality of grinding particles on the film.

12. A wire bonding machine in accordance claim 8, further comprising means coupled to the moving table for detecting movement of the capillary.

13. A wire bonding machine comprising:
   a capillary having a bottom tip;
   a bonding arm coupled to the capillary, wherein the bonding arm moves in a direction of X-Y-Z at a predetermined distance;
   a grinding film positioned below the capillary, wherein bonding arm moves the bottom tip of the capillary along a predetermined path of the grinding film;
   a clamp block positioned below the lower portions of the capillary and bonding arm and on top of a semiconductor device, the clamp block having an open area for wire bonding the semiconductor device;
   a cleaning die positioned on and removably attached to the clamp block and directly next to the open area for wire bonding the semiconductor device, the grinding film attached to the cleaning die; and
   a control mechanism for providing automated cleaning of the bottom tip by sending control signals to allow removal of a wire used for wire bonding, to transmit ultrasonic waves energy to the bottom tip of the capillary and for detecting a present location of the bottom tip of the capillary and comparing the present location to a contact position of the cleaning die to minimize movement in an X-Y-Z direction between the capillary and the cleaning die.

14. A wire bonding machine in accordance with claim 13, further comprising a clamp attached to an upper portion of the capillary for separating a wire from the capillary.

15. A wire bonding machine in accordance with claim 13 wherein the cleaning die positioned on the clamp block and adjacent to the area for wire bonding minimizes a travel distance of the bottom tip during cleaning.

16. A wire bonding machine in accordance claim 13, further comprising:
   a moving table coupled to the bonding arm for moving the bonding arm in the direction of X-Y; and
   a linear motor coupled to the moving table for moving the bonding arm in the direction of Z.

17. A wire bonding machine in accordance claim 13, wherein the control mechanism comprises:
   an X-Y control circuit coupled to the bonding arm for controlling X-Y movement of the bonding arm;
   a Z control circuit coupled to the bonding arm for controlling Z movement of the bonding arm;
   a position detection sensor for detecting movement of the capillary; and
   a comparison circuit for and comparing the present location of the bottom tip of the capillary to the contact position of the cleaning die to minimize movement in an X-Y-Z direction of the capillary.

18. A wire bonding machine in accordance claim 13, further comprising a position detection sensor coupled to the moving table for detecting movement of the capillary.

* * * * *